(12) United States Patent
Eugene Lee et al.

(10) Patent No.: US 11,348,806 B2
(45) Date of Patent: May 31, 2022

(54) MAKING A FLAT NO-LEAD PACKAGE WITH EXPOSED ELECTROPLATED SIDE LEAD SURFACES

(71) Applicant: Texas Instruments Incorporated, Dallas, TX (US)

(72) Inventors: Lee Han Meng@ Eugene Lee, Johor (MY); Shu Hui Ooi, Kedah (MY); Anis Fauzi Abdul Aziz, Kedah (MY); Wei Fen Sueann Lim, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 651 days.

(21) Appl. No.: 14/581,233

(22) Filed: Dec. 23, 2014

(65) Prior Publication Data

US 2016/0181122 A1 Jun. 23, 2016

(51) Int. Cl.
| | |
|---|---|
| *H01L 21/44* | (2006.01) |
| *H01L 21/48* | (2006.01) |
| *C25D 7/00* | (2006.01) |
| *C25D 17/08* | (2006.01) |
| *H01L 23/495* | (2006.01) |
| *H01L 23/00* | (2006.01) |
| *H01L 21/56* | (2006.01) |
| *C25D 5/02* | (2006.01) |
| *H01L 23/31* | (2006.01) |

(52) U.S. Cl.
CPC ............ *H01L 21/4821* (2013.01); *C25D 7/00* (2013.01); *C25D 17/08* (2013.01); *H01L 23/49582* (2013.01); *H01L 24/97* (2013.01); *C25D 5/022* (2013.01); *H01L 21/561* (2013.01); *H01L 23/3107* (2013.01); *H01L 2224/48091* (2013.01); *H01L 2224/48247* (2013.01); *H01L 2224/49175* (2013.01); *H01L 2924/0002* (2013.01); *H01L 2924/181* (2013.01)

(58) Field of Classification Search
CPC ............... H01L 21/4821; H01L 23/495; H01L 21/4825; H01L 21/4832; H01L 21/4842; H01L 21/4853; H01L 21/56; H01L 23/49582; H01L 24/97; C25D 21/18; C25D 21/22; C25D 7/00; C25D 17/08
USPC .................. 438/123, 113, 458, 462; 257/676
See application file for complete search history.

(56) References Cited

U.S. PATENT DOCUMENTS

| | | | | |
|---|---|---|---|---|
| 6,573,028 B1 * | 6/2003 | Yamamoto | ............ | H01L 21/561 |
| | | | | 257/E23.004 |
| 8,076,181 B1 * | 12/2011 | Pruitt | .................... | H01L 23/495 |
| | | | | 438/111 |
| 8,453,843 B1 * | 6/2013 | Ayotte, Jr. | ........ | H01L 21/67333 |
| | | | | 206/562 |
| 8,642,461 B2 * | 2/2014 | Huening | ................ | C09J 7/0292 |
| | | | | 438/612 |

(Continued)

Primary Examiner — Kimberly N Rizkallah
Assistant Examiner — Dilinh P Nguyen
(74) Attorney, Agent, or Firm — Dawn Jos; Charles A. Brill; Frank D. Cimino

(57) ABSTRACT

A method of making Flat No-Lead Packages with plated lead surfaces exposed on lateral faces thereof. The method includes providing a plurality of Flat No-Lead Packages having severed, unplated lead surfaces exposed on lateral faces thereof and having plated lead surfaces exposed on bottom faces thereof. The method further includes batch electroplating the severed unplated lead surfaces of the plurality of Flat No-Lead Packages.

13 Claims, 15 Drawing Sheets

FIG. 13

(56) References Cited

U.S. PATENT DOCUMENTS

2015/0001698 A1\* 1/2015 Jaurigue ................ H01L 24/96
257/676

\* cited by examiner

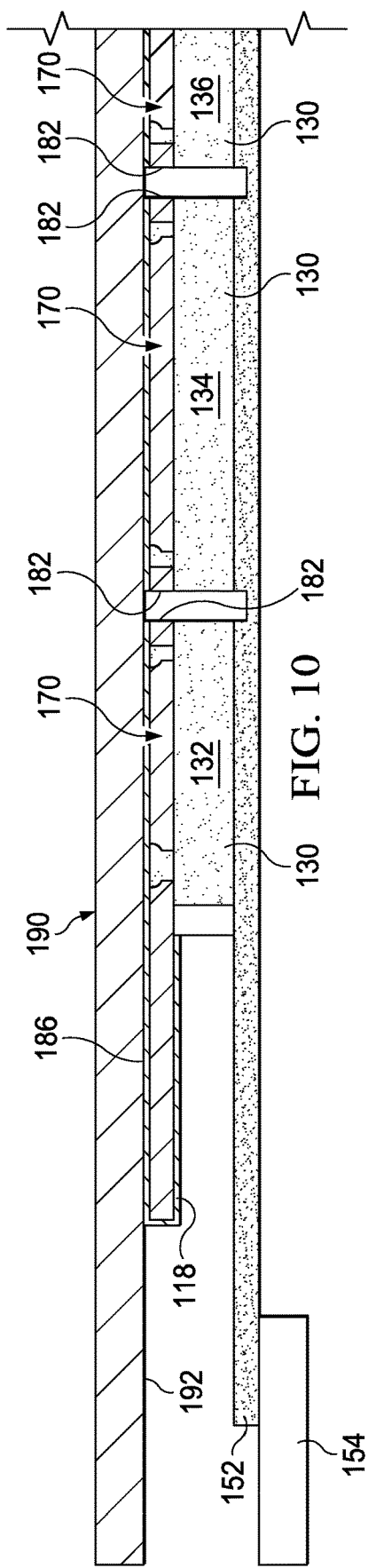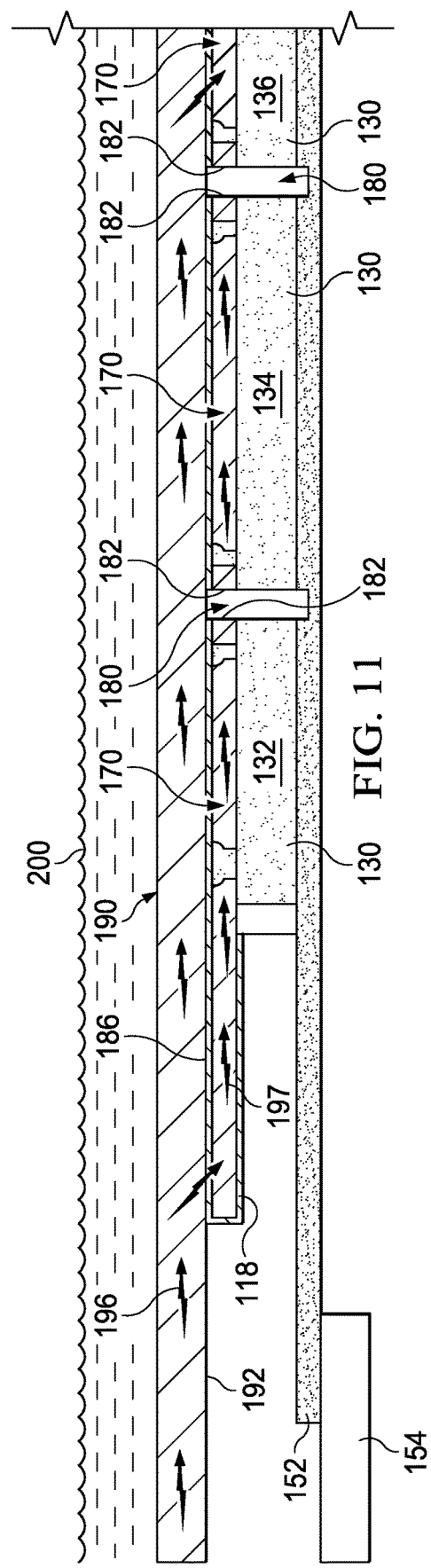

US 11,348,806 B2

MAKING A FLAT NO-LEAD PACKAGE WITH EXPOSED ELECTROPLATED SIDE LEAD SURFACES

BACKGROUND

There are many types of integrated circuit ("IC") packages. Flat No-Lead Packages, such as Quad Flat No-Lead Packages ("QFNs") and Dual Flat No-lead Packages ("DFNs"), are Wafer Scale Chip Size Packages ("WSCSP") that have no projecting leads. Exposed leads of a Flat No-Lead Package are coplanar with bottom and side faces of the package. Typically, the exposed lead surfaces on the bottom face are plated and those on the side faces are not.

SUMMARY

Disclosed herein are example methods of making Flat No-Lead Packages, such as QFNs and DFNs, with plated severed lead surfaces exposed on lateral side surfaces thereof. (As used herein, "plated severed lead surface," refers to a severed/cut surface of a lead, which has been plated.) One embodiment of a method of making Flat No-Lead Packages with plated lead surfaces exposed on lateral sidewall surfaces of said Flat No-Lead Packages includes providing a plurality of Flat No-Lead Packages having severed, unplated lead surfaces exposed on lateral side surfaces thereof and having plated lead surfaces on bottom surfaces thereof; and batch electroplating the severed unplated lead surfaces of said plurality of Flat No-Lead Packages.

Also disclosed is an assembly for electroplating a plurality of severed lead surfaces that are exposed on sidewall portions of a plurality of Flat No-Lead Packages that includes an electroplating bath and a tray apparatus immersible in the bath that has a tray bottom plate with a plurality of pockets adapted to support the Flat No-Lead Packages therein and a tray cover plate adapted to make engaging contact with plated leadframe surfaces of Flat No-Lead Packages mounted in the pockets of the tray bottom plate.

Also disclosed is a Flat No-Lead Package including a block of mold compound having a bottom face and a plurality of lateral side faces and a plurality of leads exposed on the bottom face. The plurality of leads have severed electroplated end faces exposed on at least one of the plurality of lateral side faces of the block.

BRIEF DESCRIPTION OF THE DRAWINGS

FIG. 10 is the side elevation view of FIG. 9, after placing a plate of electrically conductive material against exposed plated leadframe surfaces of the singulated leadframe strip in another stage of the example Flat No-Lead Package formation process.

FIG. 11 is the side elevation view of FIG. 10 showing flow of electric current through the plate of conductor material and leadframes during another stage of the example Flat No-Lead Package formation process.

DETAILED DESCRIPTION

Figure 1:
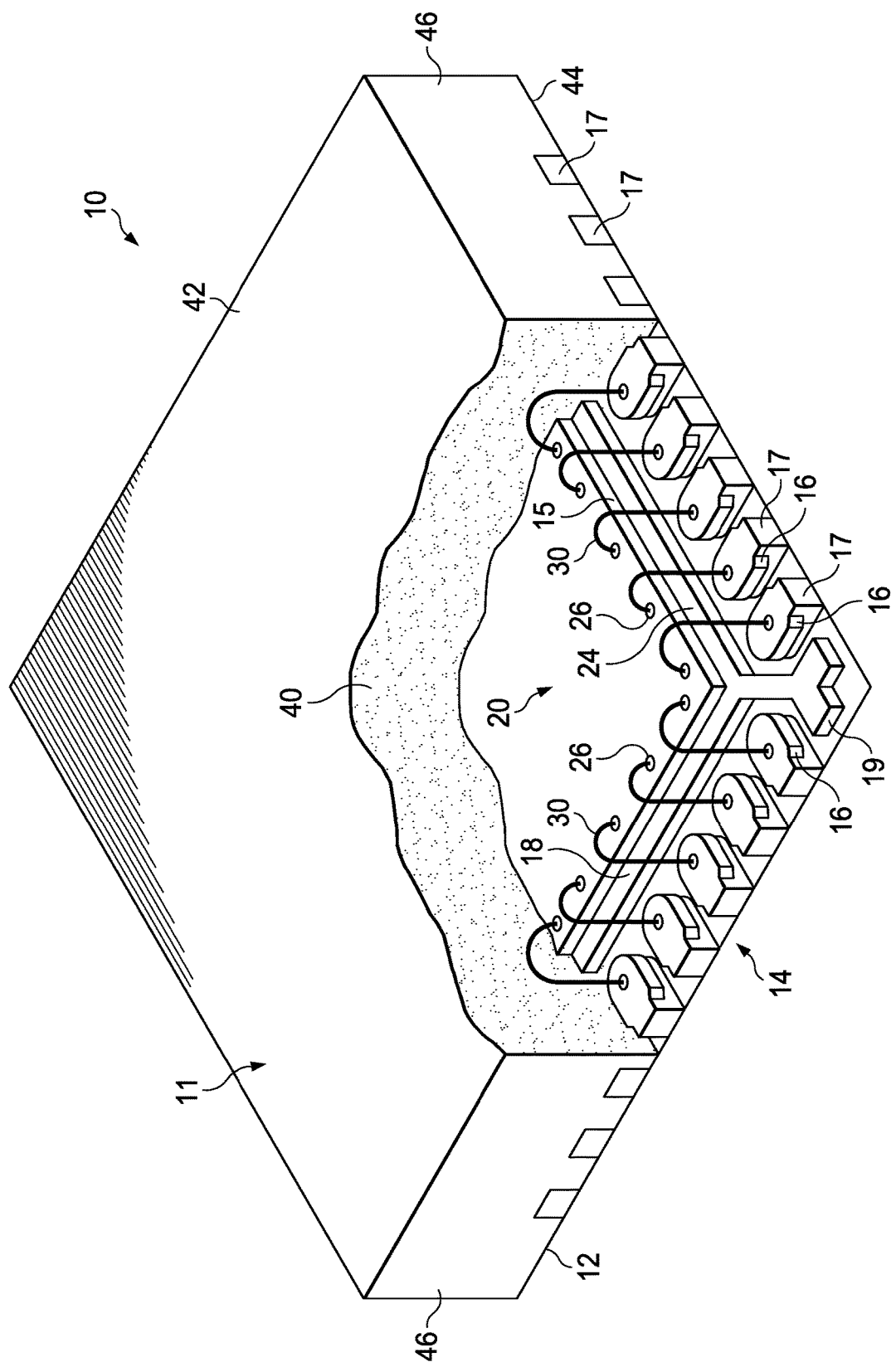
FIG. 1 is a broken away isometric view of a prior art Quad Flat No-Lead Package ("QFN").
Figure 2:
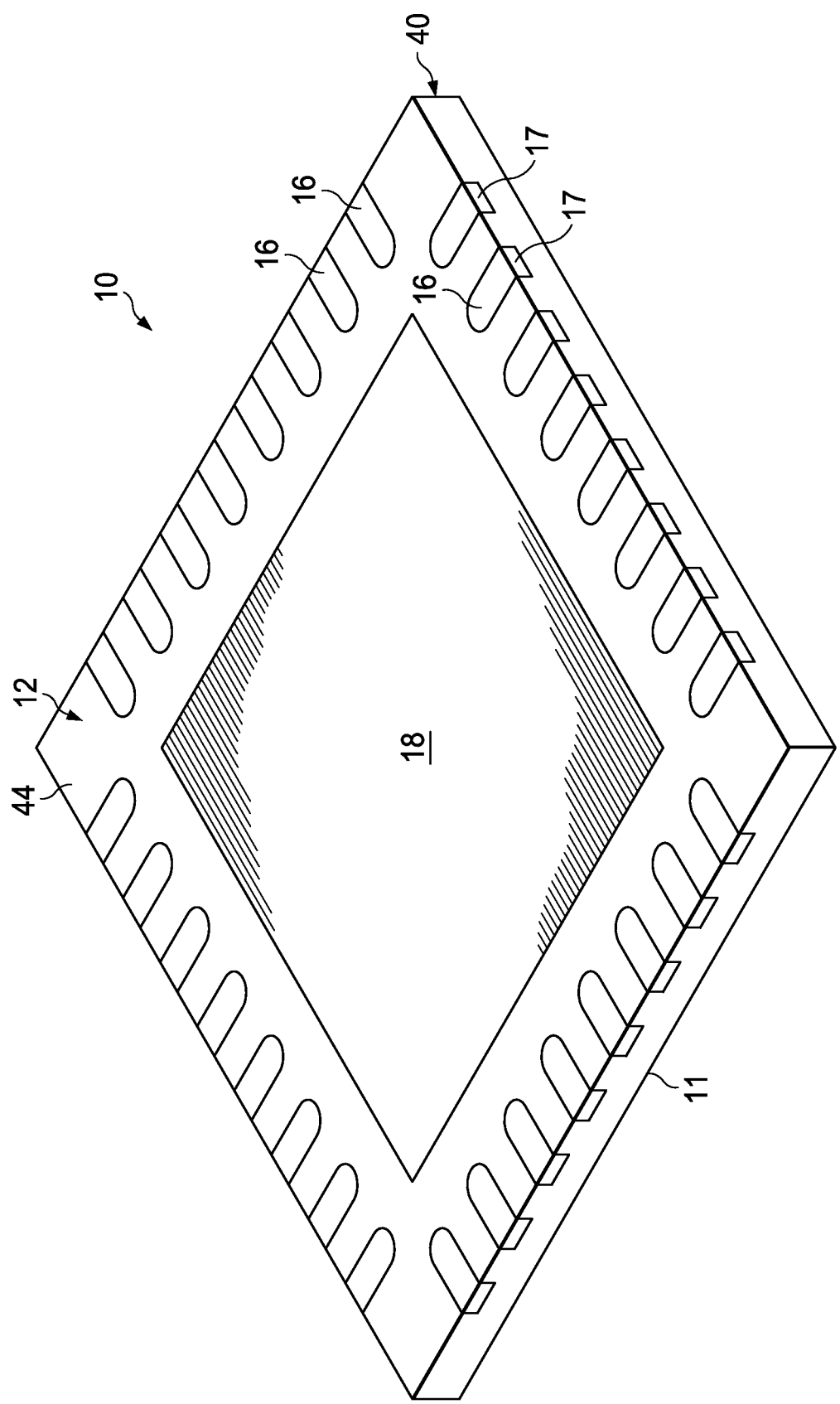
FIG. 2 is a bottom isometric view of the prior art QFN of FIG. 1.

FIG. 1 is a broken away isometric view of a conventional, QFN type, Flat No-Lead Package 10. FIG. 2 is an isometric bottom view of the Flat No-Lead Package 10 of FIG. 1. The Flat No-Lead Package 10 has a top portion 11 and a bottom portion 12. The package 10 includes a leadframe 14 and an integrated circuit die 20 mounted on a die pad 18 of the leadframe 14. Bond wires 30 connect surface contacts 26 on the die 20 with leads 16 of the leadframe 14. A block of encapsulating mold compound 40 having a top face 42, bottom face 44 and four lateral side faces 46 covers the leadframe 14, die 20 and bond wires 30. Bottom surfaces of the leads 16 and die pad 18 are exposed and flush with the bottom face 44 of the mold compound block. In most Flat No-Lead Packages, the bottom surfaces of the leadframe 14 are plated. The lateral sides 46 of No-Lead Packages typically have exposed thereon, severed end faces 17 of leads 16 that are not plated.

Conventional Flat No-Lead package formation will now be described. During conventional package formation a plurality of dies 20 are mounted on corresponding die pads 18 of a plurality of integrally connected leadframes 14. The dies 20 are then connected to leads 16 of the associated leadframes 14 by bond wires 30. Next, encapsulating mold compound 40 is applied to this large strip of integrally connected leadframes having dies attached and wire bonded thereto. The leadframe 14 is generally made from copper, aluminum, gold or other metal. After molding, a copper leadframe is usually plated with another metal, such as tin, to prevent rusting and to improve solder wetting. The molded and plated leadframe/die assembly is then singulated into a plurality of individual Flat No-Lead Packages 10. The singulation ("dicing") is usually performed by cutting the molded and plated leadframe/die assembly with a rotating saw blade. The bottom surface of the leadframe 14 is exposed within and coplanar with a bottom face 44 of the block of encapsulating mold compound 40, During singulation of individual Flat No-Lead Packages 10 from a larger encapsulated leadframe assembly, lateral end portions of peripheral leads 16 are severed. As a result of singulation, severed end face surfaces 17 of the leads 16, which are not plated, are exposed at lateral side faces 42 of the block of encapsulating mold compound 40. Because the severed lead faces 17 are not plated, oxidation often occurs and wetting of these lead faces 1 during solder attachment of the package 10 to a printed circuit ("PC") board is generally poor.

Figure 13:
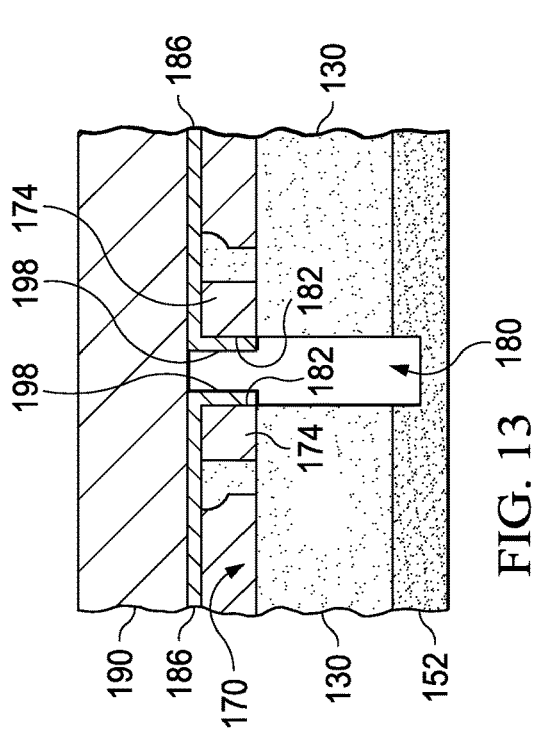
FIG. 13 is a magnified view of a portion of FIG. 12.
Figure 14:
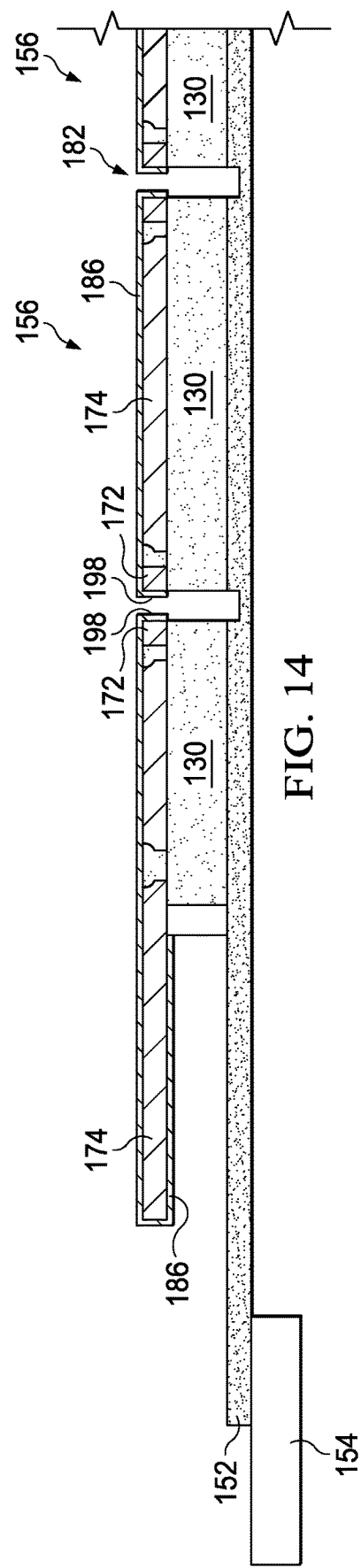
FIG. 14 is a side elevation view identical to FIG. 12 except with the plate of conductive material removed in another stage of the example Flat No-Lead Package formation process.
Figure 18:
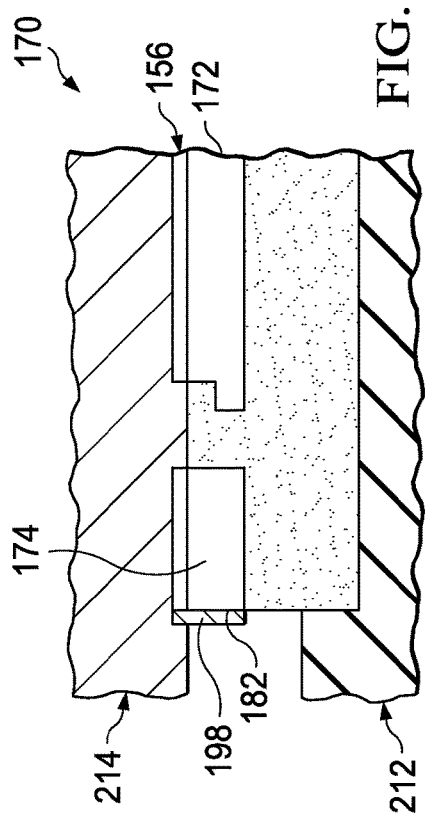
FIG. 18 is a detail from FIG. 17.
Figure 19:
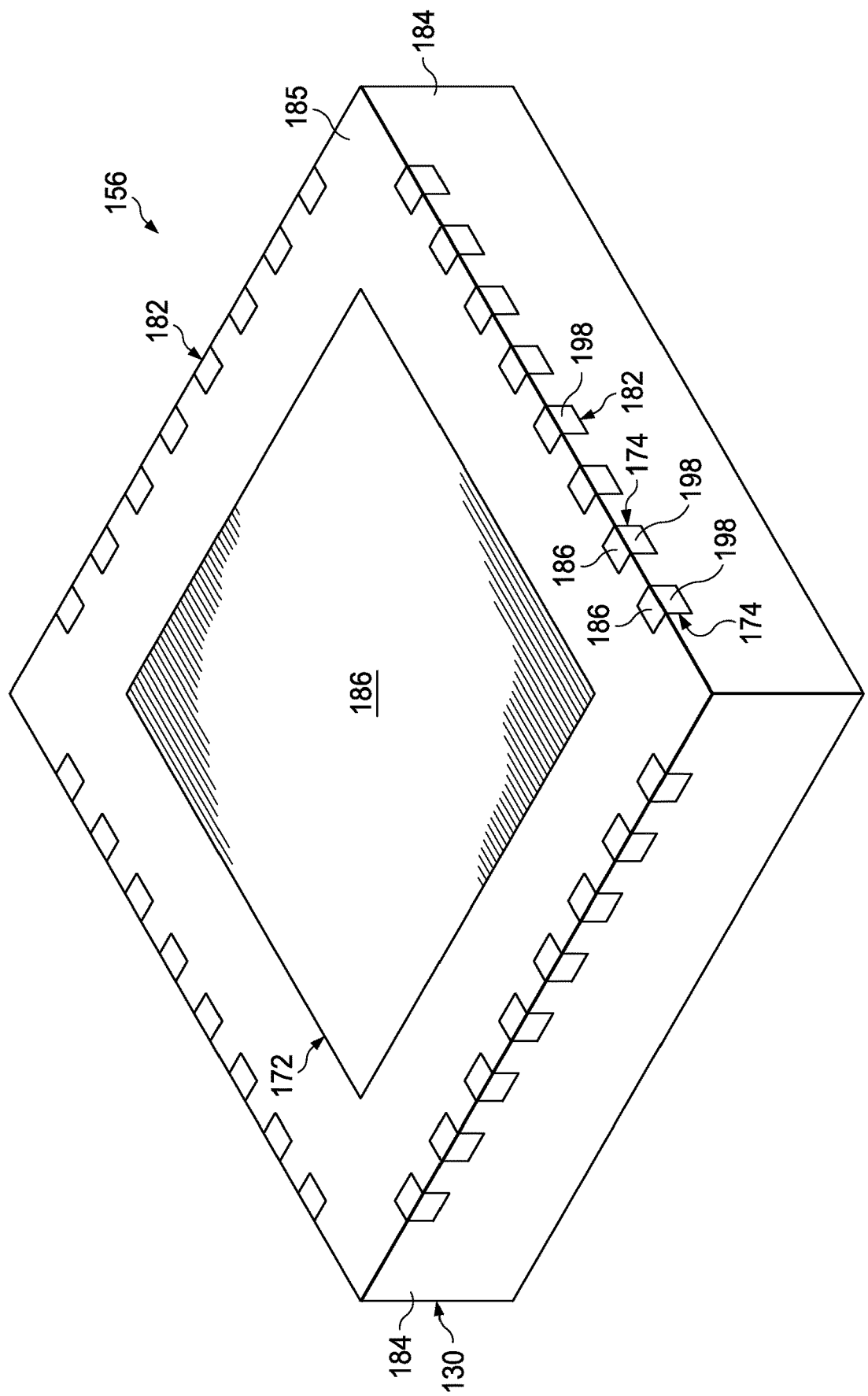
FIG. 19 is a partially cut away bottom isometric view of a Flat No-Lead Package made in accordance with methods described herein.

FIGS. 3-19 show various stages of example methods of making Flat No-Lead Packages 156, FIGS. 14 and 19. Each of the Flat No-Lead Packages 156 made by these methods includes a block of mold compound 130 having a bottom face 185 and a plurality of lateral side faces 184 and a plurality of leads 174 exposed on the bottom face 185. The plurality of leads 174 have severed electroplated end faces 182 exposed on at least one of the plurality of lateral side faces 184 of the block 130. The example method embodiments will now be described in detail with reference to FIGS. 3-19.

Figure 3:
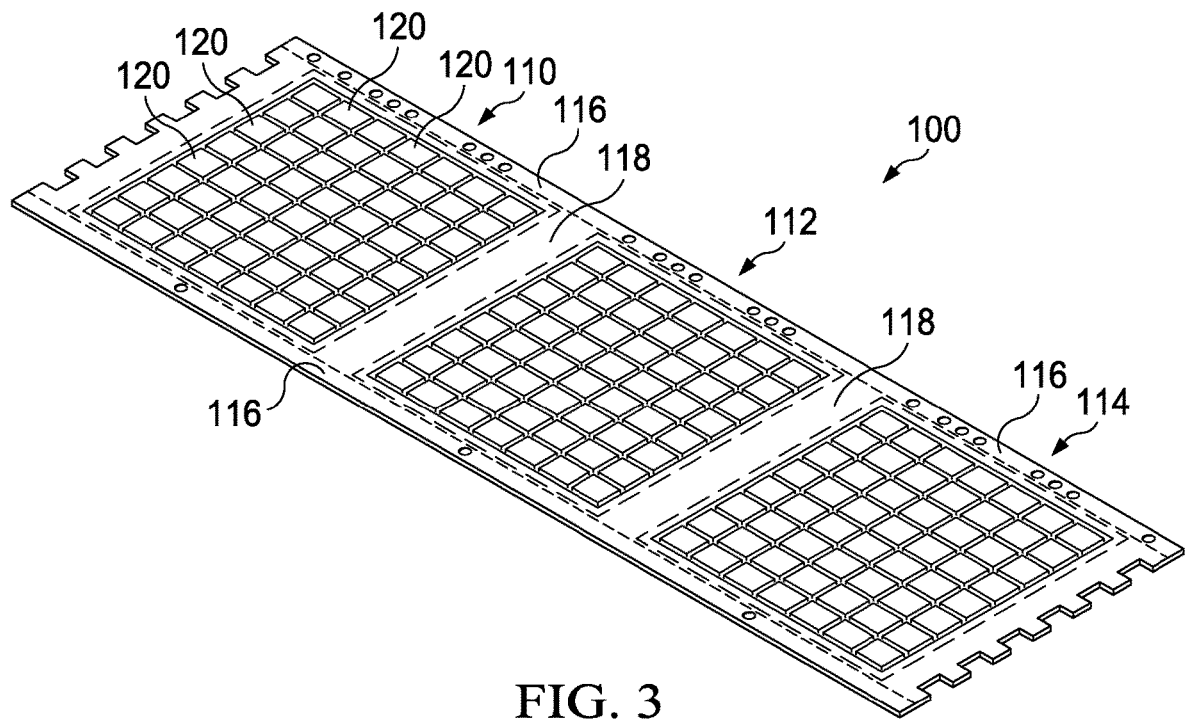
FIG. 3 is an isometric bottom view of a leadframe strip at one stage of an example, new Flat No-Lead Package formation process.

In FIG. 3, a leadframe strip 100 has three panels 110, 112 and 114. Each of the panels in this embodiment comprises an integrally connected 7×8 array of leadframes 120 positioned between two integral connector rails 116, 116. The panels 110 are separated by integral connector strips 118.

Figure 4:
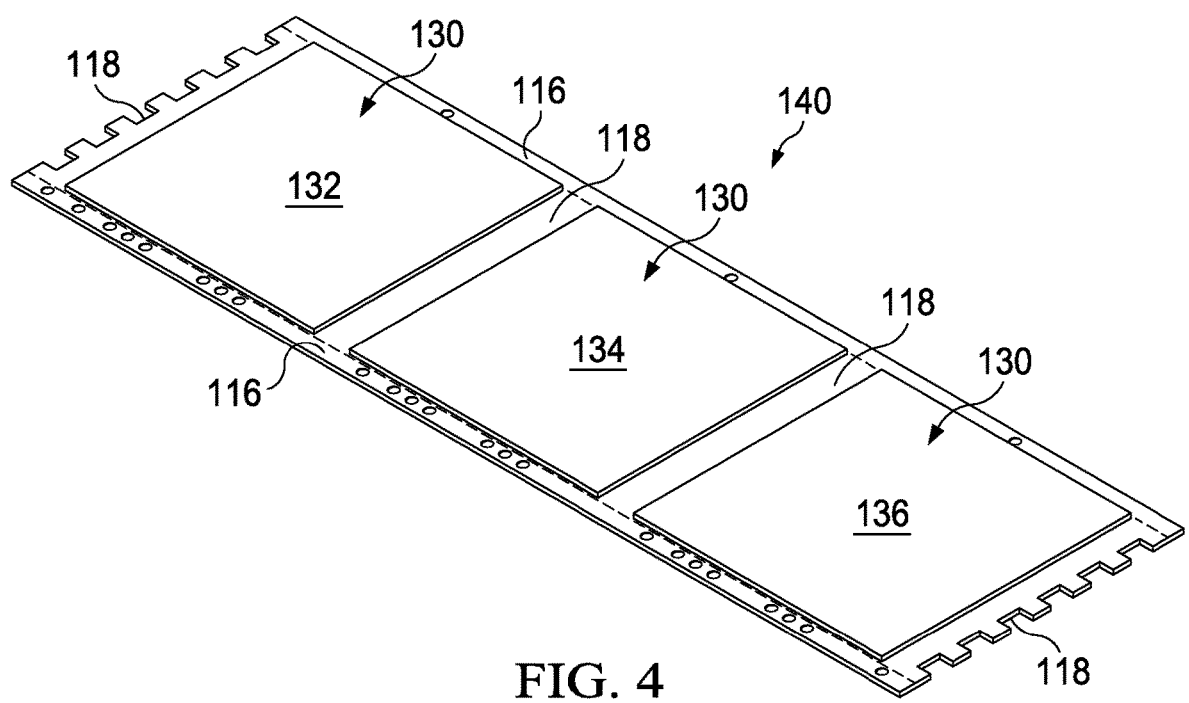
FIG. 4 is an isometric top view of the leadframe strip of FIG. 3 after a molding stage of the example Flat No-Lead Package formation process.

FIG. 4 is an isometric top view of the leadframe strip 100 of FIG. 3 after conventional molding of the strip 100 to form a molded leadframe assembly 140. A die 160, FIG. 9, (not shown in FIG. 4) is attached to a top surface of each leadframe 120. Each of the dies 160 is connected by a bond wire 162 to a lead, e.g. 172, of an associated leadframe 170, FIG. 9, (not shown in FIG. 4). A mold compound layer block 130 (referred to individually as blocks 132, 134, 136) is applied to each leadframe grid panel 110, 120, 114, as by use of a conventional transfer mold.

Figure 5:
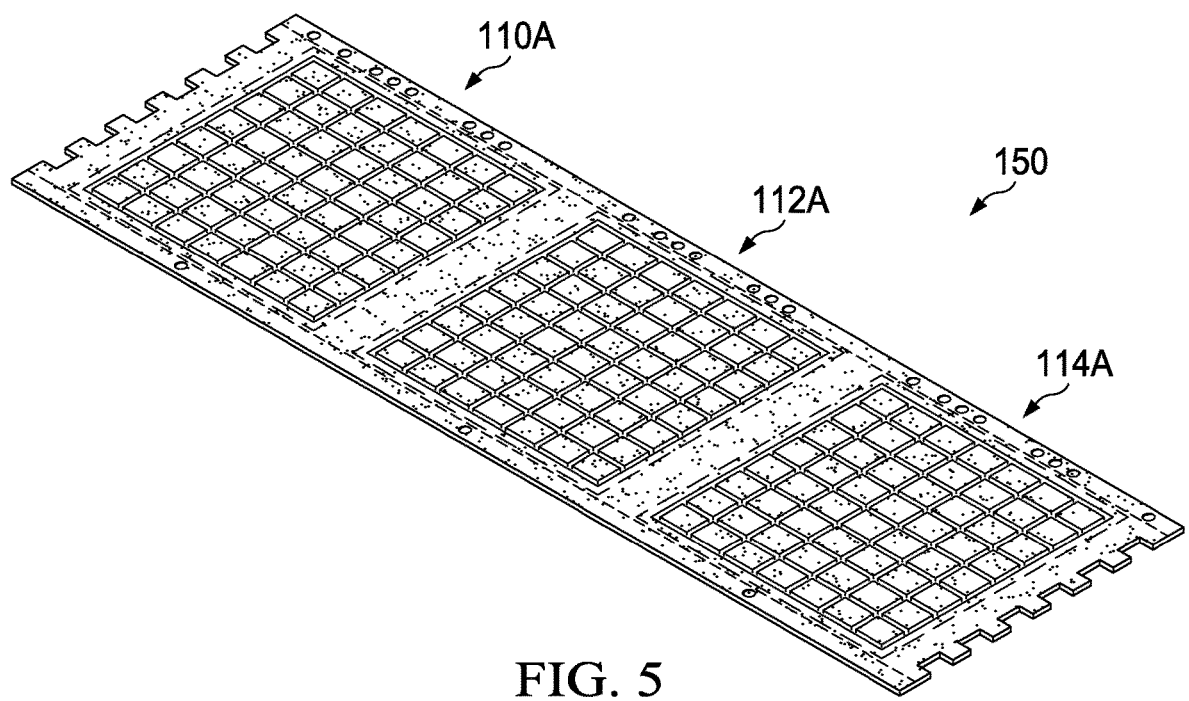
FIG. 5 is a bottom isometric view of a leadframe strip after an electroplating stage of the example Flat No-Lead Package formation process.
Figure 6:
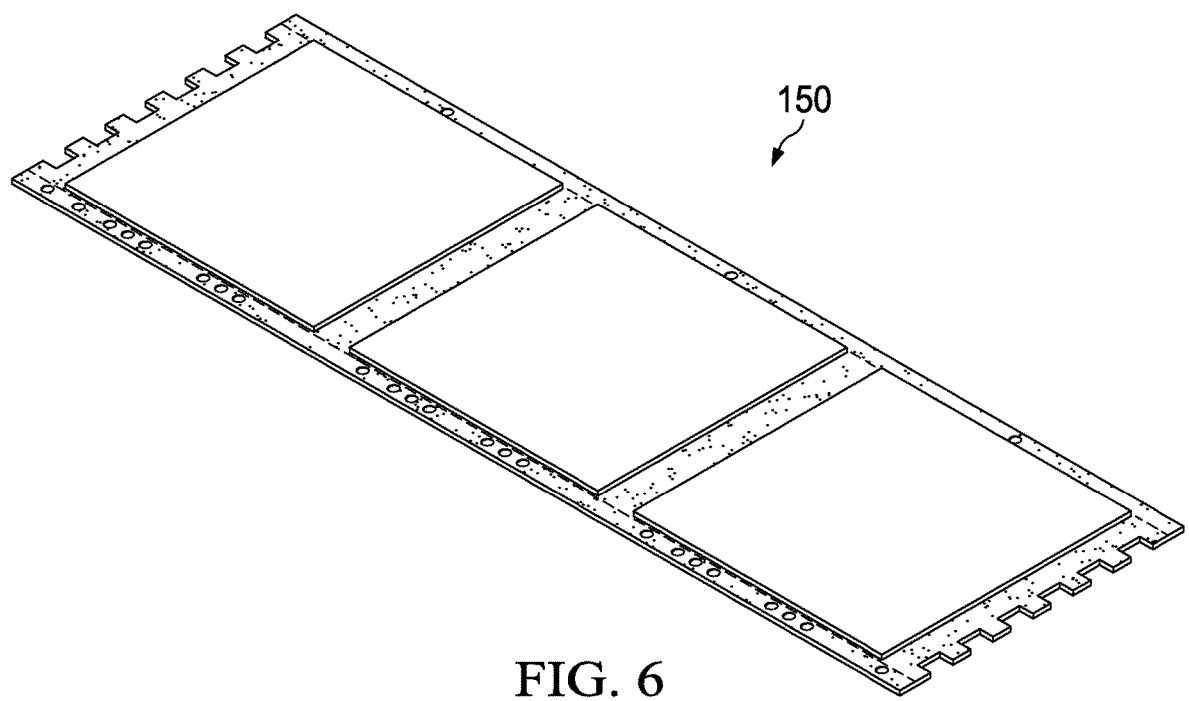
FIG. 6 is a top plan view of a molded and plated leadframe strip after a plating stage of the example Flat No-Lead Package formation process.
Figure 7:
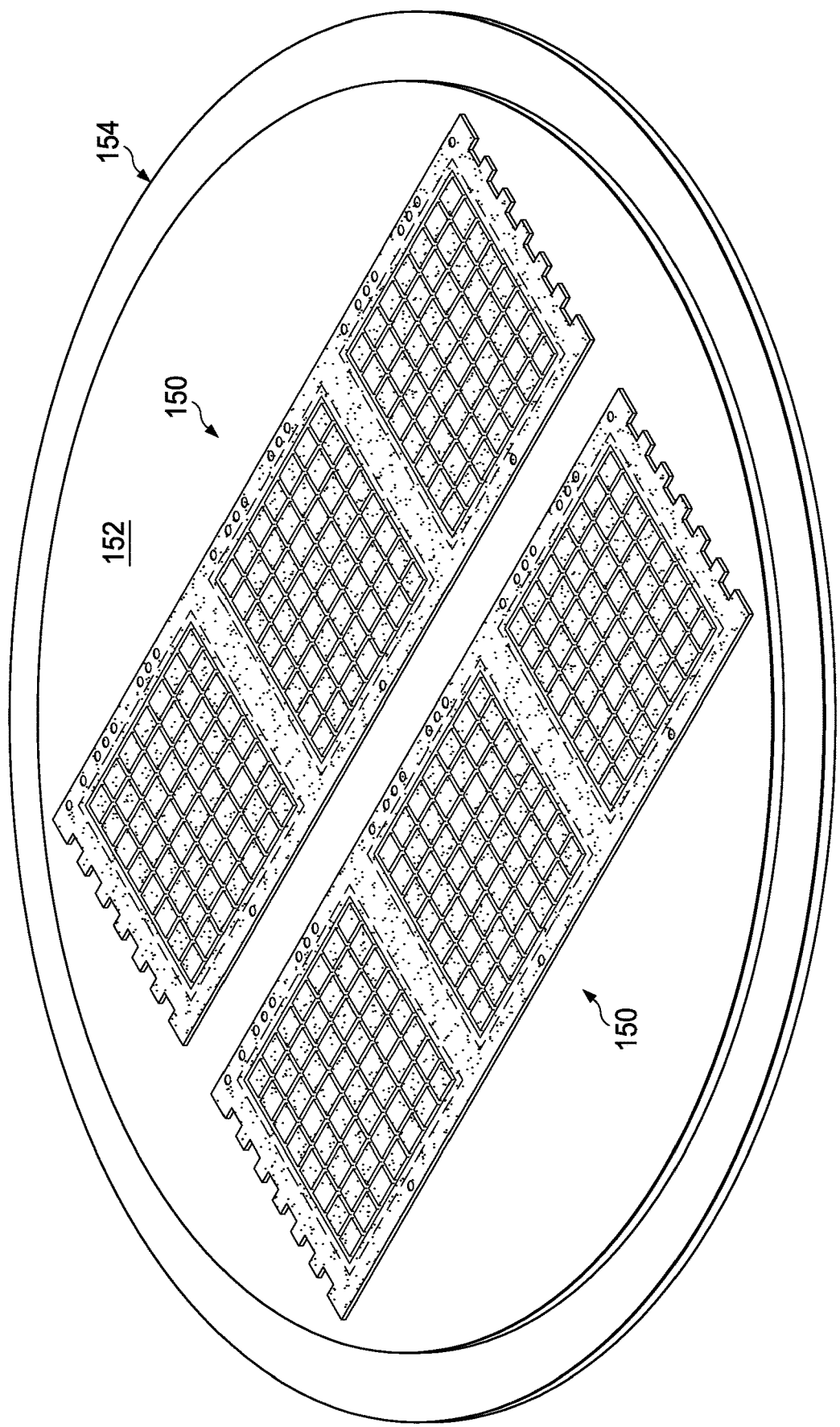
FIG. 7 is a top isometric view of two plated leadframe strips mounted on support tape attached to a wafer ring in a tape mounting stage of the example Flat No-Lead Package formation process.

The molded leadframe strip assembly 140 of FIG. 4 is then electroplated to provide a plated leadframe strip assembly 150. A top isometric view and a bottom isometric view of this plated leadframe strip assembly 150 are illustrated in FIGS. 5 and 6, respectively. Next, one or more of the plated leadframe strip assemblies 150 are mounted on the tacky side of a sheet of dicing tape 152, which is attached to a wafer ring 154, as illustrated in FIG. 7.

Figure 8:
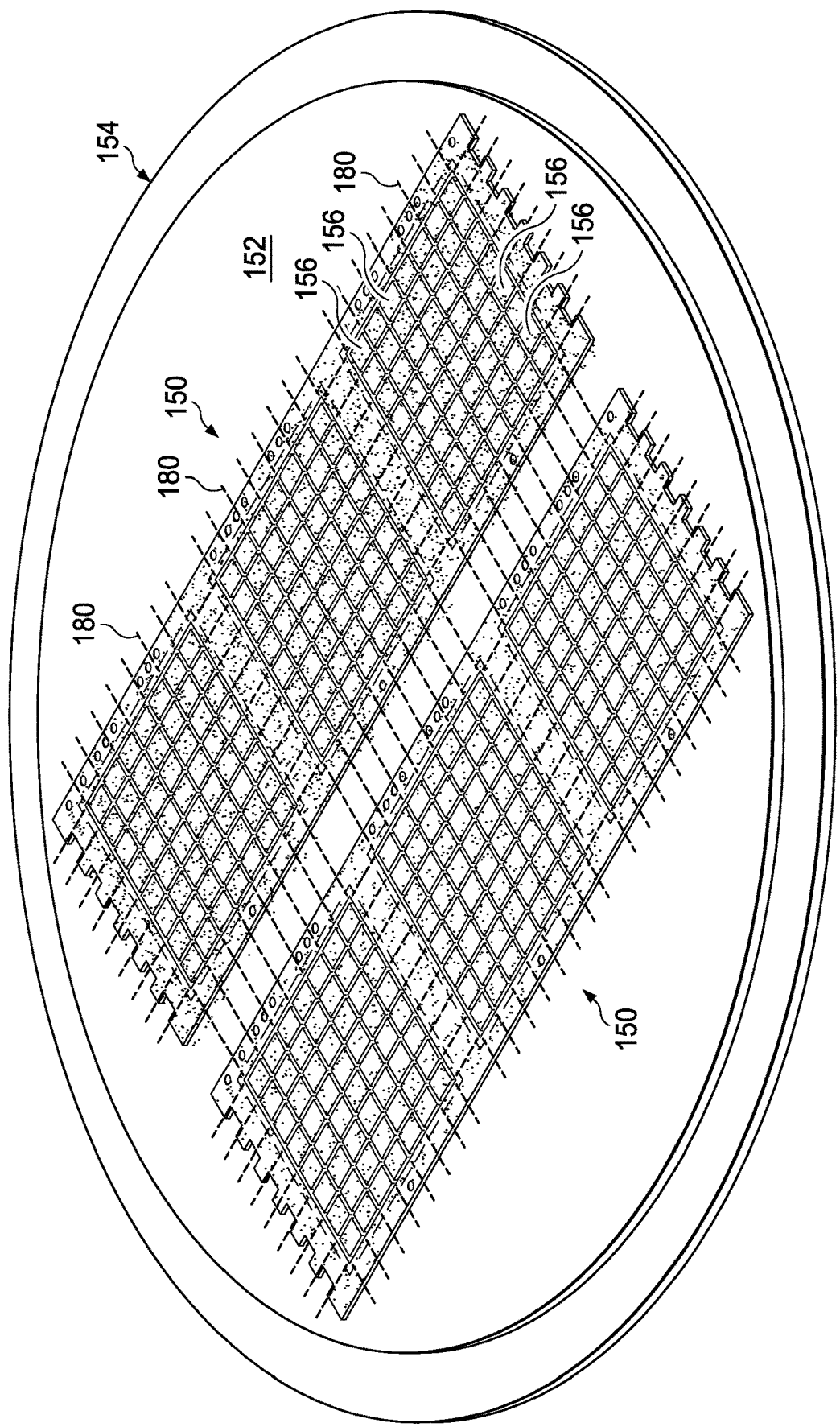
FIG. 8 is a top isometric view of FIG. 7 after singulation of the two plated leadframe strips shown in FIG. 7 in a singulation stage of the example Flat No-Lead Package formation process.
Figure 9:
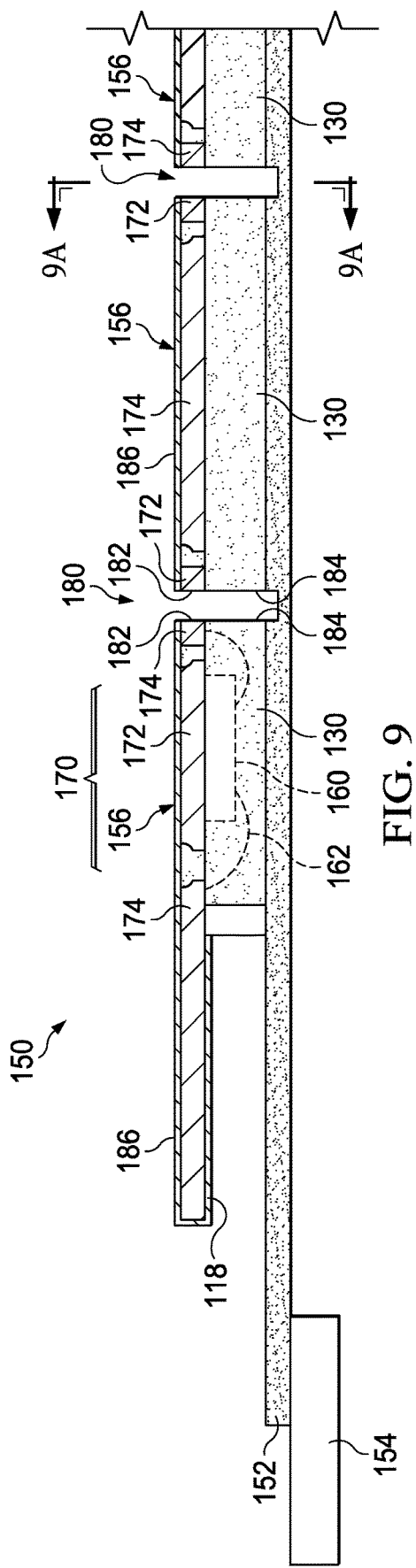
FIG. 9 is a magnified side elevation view of a portion of the singulated, plated leadframe strip of FIG. 8.
Figure 9A:
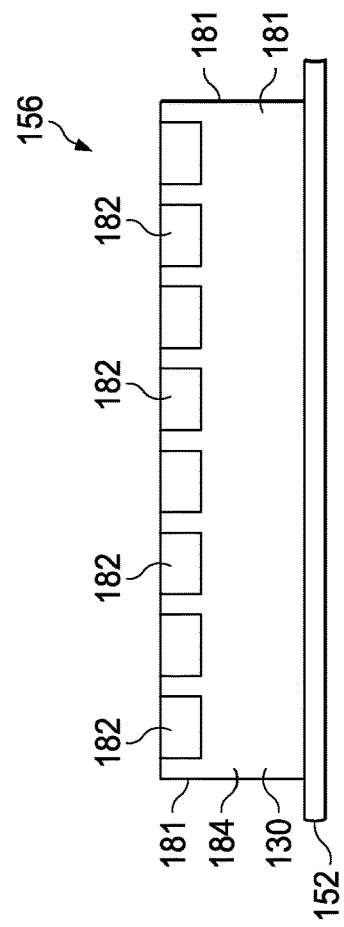
FIG. 9A is a detailed sectional view of FIG. 9.

As illustrated by FIGS. 8 and 9, the plated leadframe strip assemblies 150 are then singulated ("diced"). During singulation each leadframe strip assembly 150 is cut by a singulation saw (not shown) along saw streets 180 into a plurality of individual Flat No-Lead Packages 156. The particular type of Flat No-Lead Packages 156, illustrated herein as QFNs 156. Each QFNs 156 has a separate lead-frame 170 therein. Each of the leadframes 170 has a die pad 172 and a plurality of leads 174 arranged around the die pad 172, FIG. 9. A die 160 is mounted on each die pad 172, FIG. 9. Each saw street 180 passes through a plurality of leads 172. Thus, as shown by FIG. 9A, each QFN 156 produced by the sawing has four (only three shown) saw cut lateral side faces 181. Each of these lateral side face 181 has exposed thereon a plurality of severed, unplated lead faces 182, as well as a severed mold compound face 184.

With further reference to FIG. 9, it is noted that at the bottom face of each QFN (which bottom surfaces faces upwardly in FIG. 9), plated surface portions 186 of the leads 172 and die pad 174 are exposed. (These plated surface portions 186 were created by conventional electroplating as previously indicated with reference to FIGS. 5 and 6 above.) Thus, all exposed surface portions of the leadframe 170, except for the lead severed end faces 182, FIG. 9A, are plated at this stage. (In conventional Flat No-Lead package formation the process steps and intermediate structures produced may be generally the same as those described to this point with reference to FIGS. 3-9A.)

In some Flat-No-Lead Package applications, it may be desirable for the severed face portions 182 of the leads 172 to be plated. The further steps by which such severed lead faces 182 are plated and the resulting products will now be described.

Figure 12:
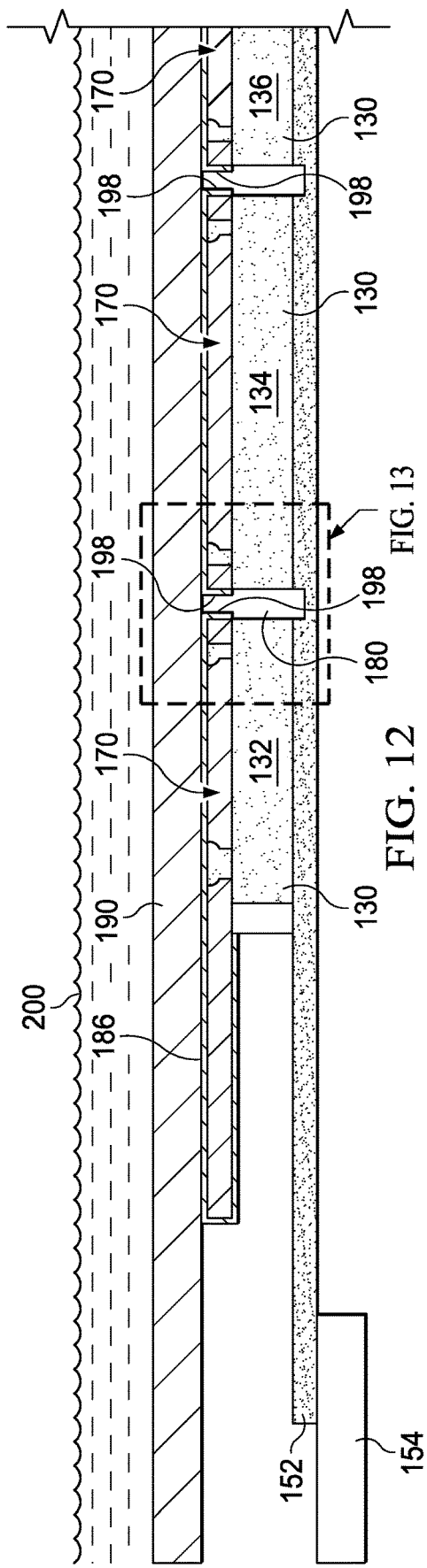
FIG. 12 is a side elevation view identical to FIG. 11, except showing the plating of severed leads, which occurs during this stage of the example Flat No-Lead Package formation process.

As shown by FIG. 10 a lower surface 192 of a conductor strip/plate 190 is placed in engagement with the plated surfaces 186 of the leadframes 170. All of the plated surfaces 186, which are associated with all the QFNs 156 attached to tape 152 after singulation of the plated leadframe assembly 150, may thus be engaged by a single conductor plate 190. Next, as illustrated by FIG. 11, the entire wafer ring 154, plate 190 and molded leadframe assembly 150 are placed in an electroplating bath 200. The composition of the electroplating bath will depend upon the type of metal plating that is being performed. Various electroplating baths used in electroplating processes are known in the art. The conductor plate 190 is attached, as by clamps or other suitable electrical connection means (not shown), to the cathode of a power source and the anode is placed in electrical contact with the bath 200. The power source (not shown in FIG. 11) is then activated to produce a flow of electrical current 196 through the conductor plate 190. The flow of current 196 through the conductor plate 190 and the associated flow of current 197 through the leadframes 170 cause the cut surface portions 182 of the leads 174 to be covered with an electroplated layer 198, as shown in FIGS. 12 and 13.

As shown by FIG. 14, after completion of the electroplating process the assembly is removed from the electroplating bath 200, the conductor plate 190 is removed, the plated QFNs are sent to testing and are subsequently shipped to customers. Thus, a method of batch processing a plurality of Flat No-Lead Packages, such as QFNs 156, to plate severed lead faces 182 thereon has been described.

Figure 15:
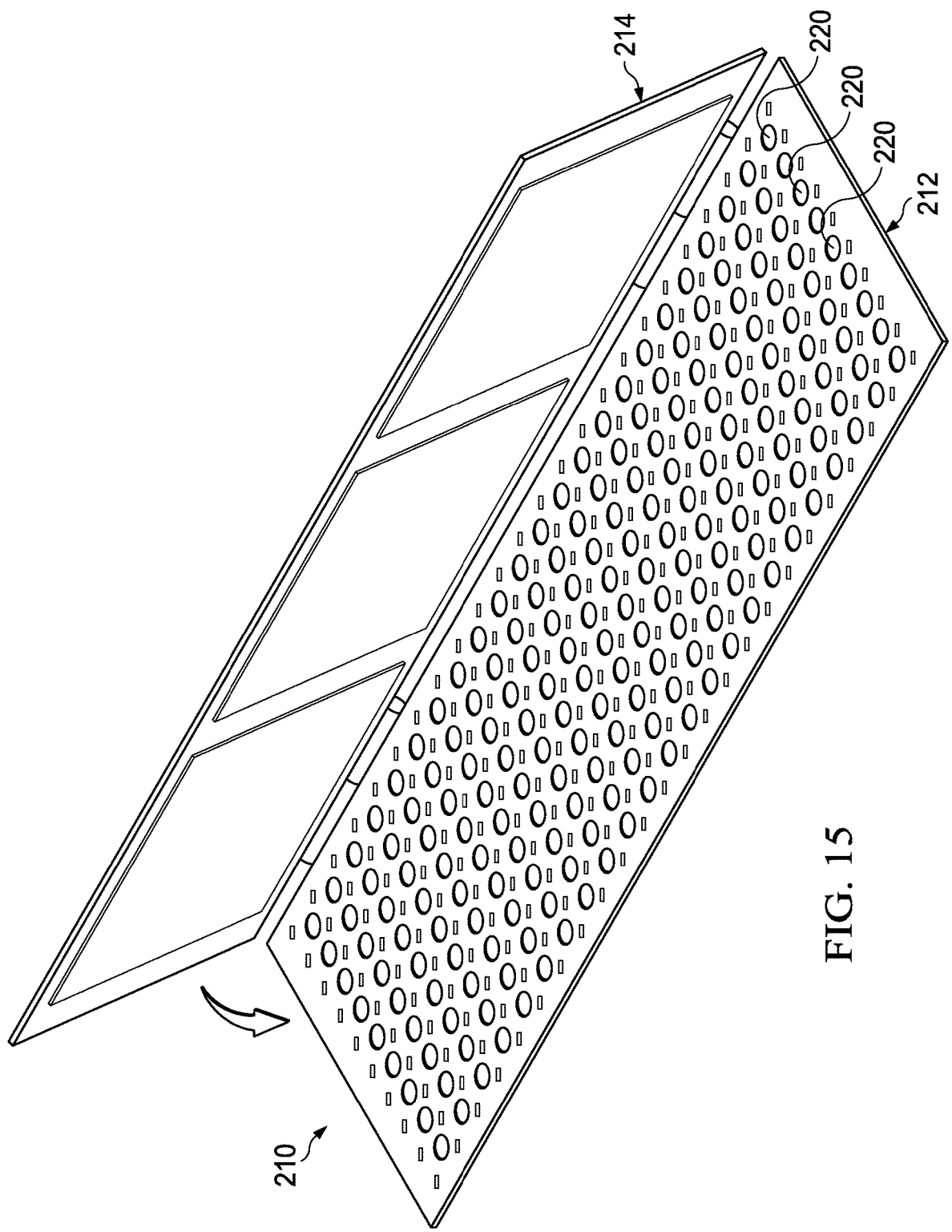
FIG. 15 is an isometric view of an empty tray assembly, which may be used in an alternate embodiment of the example Flat No-Lead Package formation process.
Figure 16:
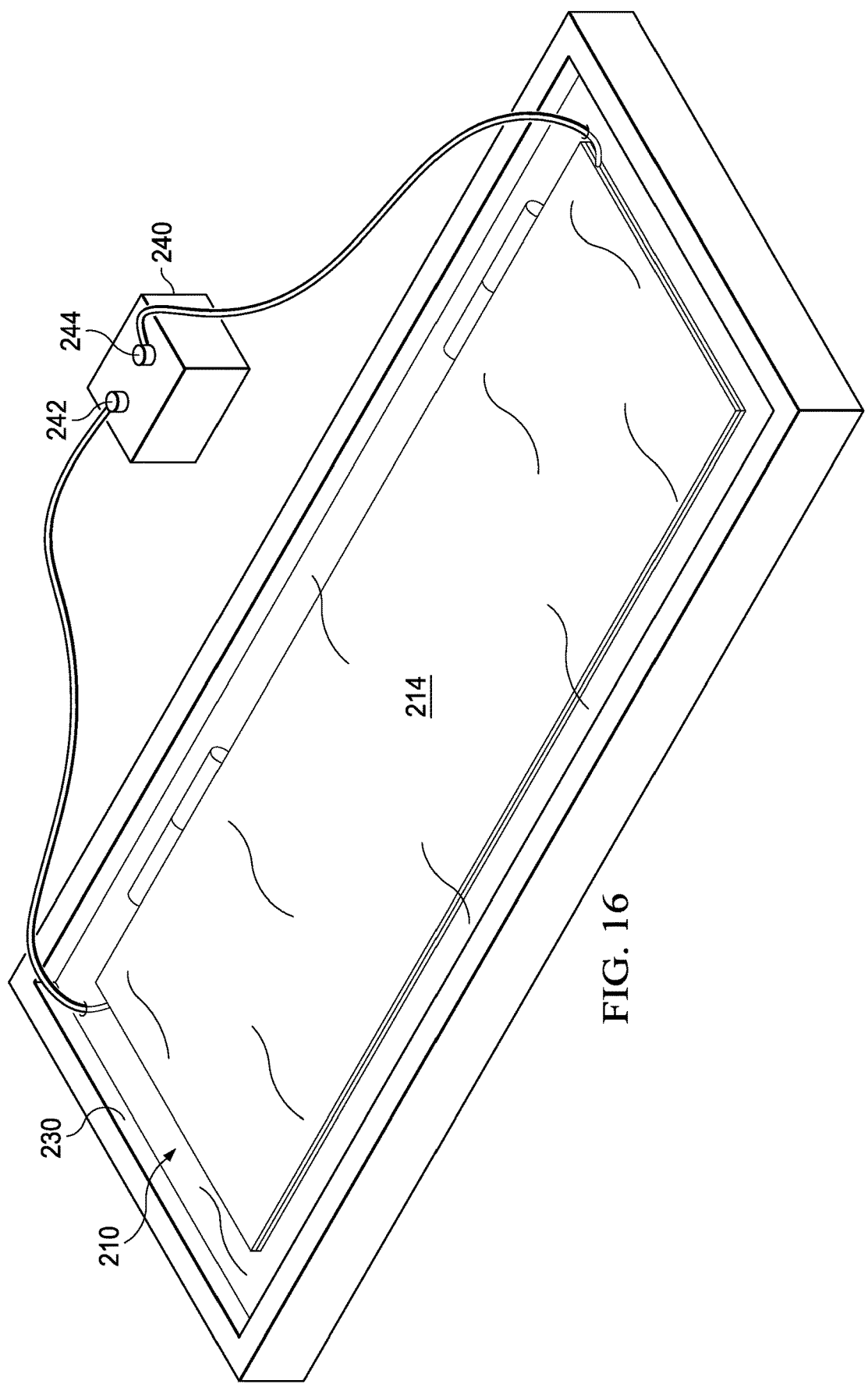
FIG. 16 is an isometric view of the tray assembly of FIG. 15 after mounting of Flat No-Lead Packages in pocket portions thereof and closing the conductive lid.

Another assembly for electroplating severed, unplated lead faces 182 of the assembly shown in FIG. 9 will now be described. As shown in FIG. 15, a tray assembly 210 includes a nonconductive bottom tray 214 and a conductive top plate 214 which may be hinged to the nonconductive bottom tray 212. Nonconductive bottom tray 212 has a plurality of QFN holders (e.g. pockets) 220 provided therein which may be arranged in a rectangular grid. In this embodiment the individually severed QFNs shown in FIG. 9 are placed, as by use of a conventional pick and place machine, in the pockets 220 of bottom tray 212. The conductive top plate member 214 is then closed, placing a conductive surface of the top plate 214 in engagement with the plated bottom surfaces 186 of the various leadframe portions of the QFNs 156 received in the pockets 220. Next, as illustrated by FIG. 16 the tray assembly 210 is submerged in an electroplating baths 230.

Figure 17:
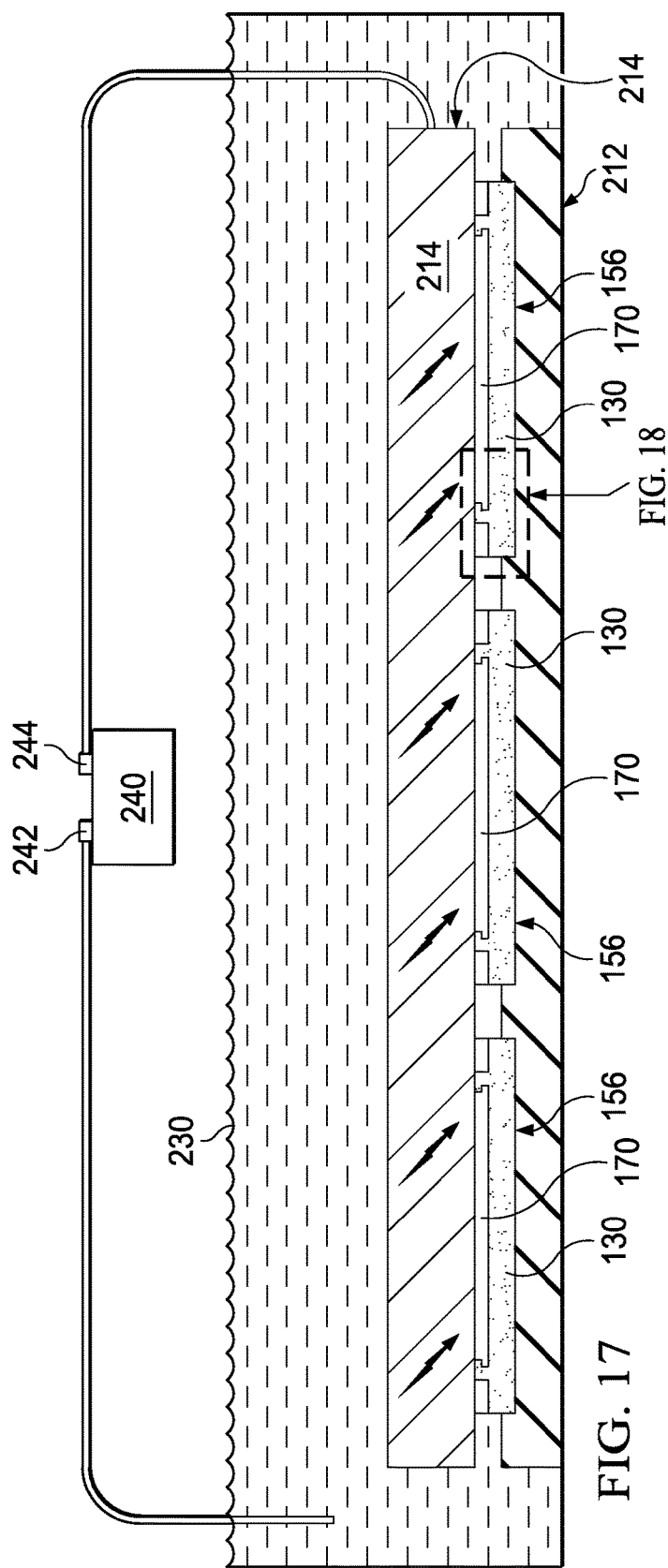
FIG. 17 is a cross-sectional side elevation view of the closed tray assembly of FIG. 16.

Next, as shown by FIGS. 17 and 18, the electroplating bath 230 and the conductive top plate member 214 are connected to an electroplating power source 240 comprising an anode 242 in electrical contact with the bath and a cathode 244 attached to the conductive top plate 214. The power source 240 is activated to provide a current flow through the top plate 214, which produces a current flow through the contacted leadframes 170. This current flow through the leadframes 170 causes the severed end faces 182 of all the leads 174 to be plated with a plating layer 198. Thus, a second method of batch processing a plurality of Flat No-Lead Packages, such as QFNs 156, to plate 198 severed lead faces 182 thereon has been described.

FIG. 19 is a partially cut away bottom isometric view of a Flat No-Lead Package, which may be made in accordance with methods described herein. The Flat No-Lead Package shown in FIG. 19 is a QFN 156. The QFN includes a block of mold compound 130 having a bottom wall 185 (facing upwardly in FIG. 19) and a plurality of severed lateral sidewalls 184. A plurality of leads 174 and a die pad 172 are exposed on the bottom wall 185. The bottom faces of the leads 174 and die pad 172 are exposed on the bottom wall 185 of the mold compound 130 and are covered with plating material 186. The plurality of leads 174 also have severed/cut end face surfaces 182 that were exposed on the mold compound sidewalls 184 by dicing. These severed end faces 182 are covered by a metal plating layer 198, which may be, e.g., tin, nickel, palladium, gold, or a combination of all those materials or other materials, as a result of the batch electroplating described above with reference to FIGS. 10-18. The plating layer 198 is shown cut away exposing one severed lead face 182 in FIG. 19.

Figure 20:
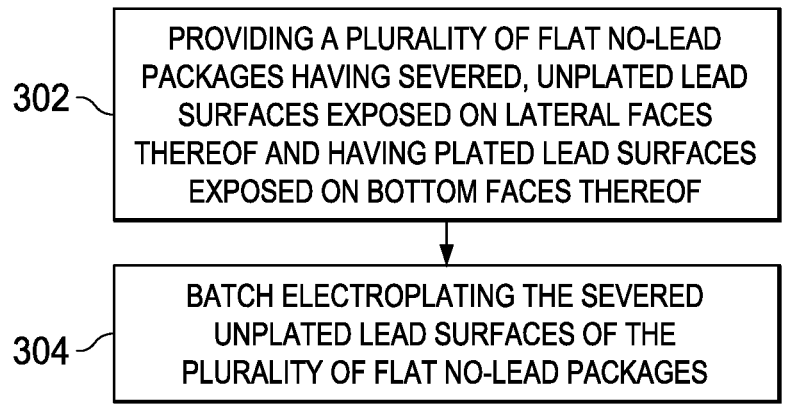
FIG. 20 is a flowchart of an example of a method of making Flat No-Lead Packages.

FIG. 20 illustrates one example method of making Flat No-Lead Packages with plated lead surfaces exposed on lateral sidewall surfaces of the Flat No-Lead Packages. The method includes, as shown at 302, providing a plurality of Flat No-Lead Packages having severed, unplated lead surfaces exposed on lateral face surfaces thereof and having plated lead surfaces on bottom faces thereof. The method also includes, as shown at 304, batch electroplating the severed unplated lead surfaces of the plurality of Flat No-Lead Packages.

Figure 21:
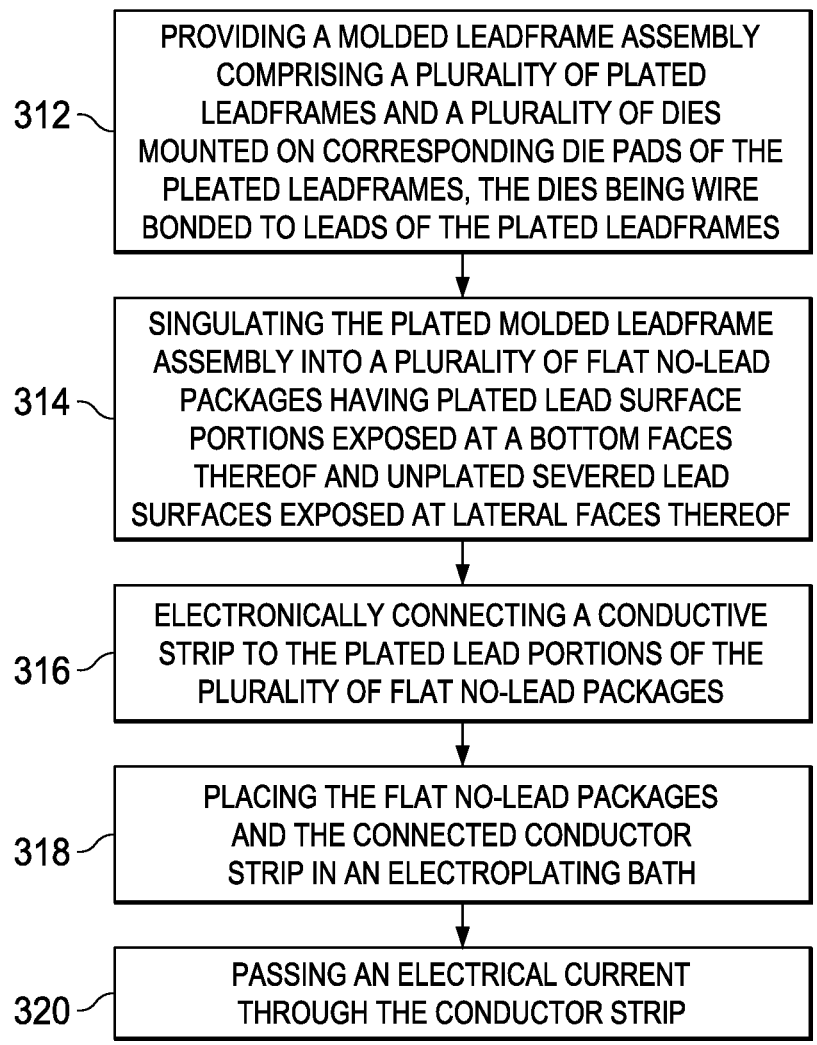
FIG. 21 is a flowchart of another example of a method of making Flat No-Lead Packages.

FIG. 21 illustrates another example method of making Flat No-Lead Packages. The method includes, as shown at 312, providing a molded leadframe assembly comprising a plurality of plated leadframes and a plurality of dies mounted on corresponding die pads of the plated leadframes, the dies being wire bonded to leads of the plated leadframes. The method also includes, as shown at 314, singulating the plated molded leadframe assembly into a plurality of Flat No-Lead Packages having plated lead surface portions exposed at bottom faces thereof and unplated severed lead surfaces exposed at lateral faces thereof. The method further includes, as shown at 316, electrically connecting a conductive strip to the plated lead portions of the plurality of Flat No-Lead Packages. The method still further includes, as shown at 318, placing the Flat No-Lead Packages and the connected conductor strip in an electroplating bath. The method also includes, as shown at 320, passing an electrical current through the conductor strip.

Although example embodiments of methods of making flat no lead packages with plated, severed lead surfaces are described in detail herein, it will become obvious to those skilled in the yard after reading this disclosure that these methods may be otherwise embodied. It is intended that the appended claims be broadly construed to cover all such alternative embodiments, except to the extent limited by the prior art.

What is claimed is:

1. A method of making Flat No-Lead Packages with plated lead surfaces exposed on lateral sidewall surfaces of said Flat No-Lead Packages comprising:
   providing a plurality of Flat No-Lead Packages having severed unplated lead surfaces exposed on lateral faces thereof and having plated lead surfaces exposed on bottom faces thereof; and
   batch electroplating only the severed unplated lead surfaces and side surfaces of the plated lead surfaces of the plurality of Flat No-Lead Packages.

2. The method of claim 1 wherein said electroplating the severed unplated lead surfaces comprises:
   electrically connecting a conductor strip to the plated lead surfaces of the plurality of Flat No-Lead Packages;
   placing the Flat No-Lead Packages and the conductor strip in an electroplating bath; and
   passing an electrical current through the conductor strip and the electroplating bath.

3. The method of claim 2 wherein said providing the plurality of Flat No-Lead Packages comprises plating exposed lead portions of the plurality of leadframes in the molded leadframe assembly.

4. The method of claim 3 wherein said providing the plurality of Flat No-Lead Packages comprises singulating the plated molded leadframe assembly into a plurality of Flat No-Lead Packages having plated lead surfaces exposed at a bottom surface thereof and severed and unplated lead surfaces exposed at sidewall portions thereof.

5. The method of claim 3 further comprising arranging the plurality of Flat No-Lead Packages in a grid.

6. The method of claim 5 wherein arranging the plurality of Flat No-Lead Packages in the grid comprises placing said plurality of Flat No-Lead Packages in pockets of a tray that are arranged in a grid.

7. The method of claim 6 wherein said electrically connecting the conductive strip to the plated lead portions of the plurality of Flat No-Lead Packages comprises closing a conductive lid against portions of the Flat No-Lead Packages extending from the pockets.

8. The method of claim 7 further comprising lifting the conductive lid after the lead surfaces exposed on lateral side surfaces of the Flat No-Lead Packages are plated.

9. The method of claim 7 further comprising removing the Flat No-Lead Packages from the pockets of the tray.

10. The method of claim 1 wherein said providing the plurality of Flat No-Lead Packages comprises providing a molded leadframe assembly having a plurality of integrally connected leadframes and a plurality of dies mounted on corresponding die pad portions of the plurality of integrally connected leadframes the dies being wire bonded to lead portions of the leadframes.

11. The method of claim 1:
   wherein said providing comprises providing the plurality of Quad Flat No-Lead Packages having severed unplated lead surfaces exposed on lateral faces thereof and having plated lead surfaces on bottom faces thereof; and wherein said batch electroplating comprises batch electroplating the severed unplated lead surfaces of said plurality of Quad Flat No-Lead Packages.

12. A method of making Flat No-Lead Packages comprising:
providing a molded leadframe assembly comprising a plurality of plated leadframes and a plurality of dies mounted on corresponding die pads of the plated leadframes, the plurality of dies being wire bonded to leads of the plated leadframes;
singulating the plated molded leadframe assembly into a plurality of Flat No-Lead Packages having plated lead surfaces exposed at bottom faces thereof and unplated severed lead surfaces exposed at lateral faces thereof;
electrically connecting a conductor strip to the plated lead surfaces of the plurality of Flat No-Lead Packages;
placing the Flat No-Lead Packages and the conductor strip in an electroplating bath; and
passing an electrical current through the conductor strip to electroplate only the unplated severed lead surfaces and side surfaces of the plated lead surfaces.

13. The method of claim 12:
wherein said singulating comprises singulating the plated molded leadframe assembly into a plurality of Quad Flat No-Lead Packages having plated lead surface portions exposed at a bottom surface thereof and unplated severed lead surfaces exposed at sidewall portions thereof;
wherein said electrically connecting comprises electrically connecting the conductor strip to the plated lead portions of the plurality of Quad Flat No-Lead Packages; and
wherein said placing comprises placing the Quad Flat No-Lead Packages and the conductor strip in an electroplating bath.

* * * * *